United States Patent
Braithwaite

(10) Patent No.: US 7,193,462 B2
(45) Date of Patent: Mar. 20, 2007

(54) RF POWER AMPLIFIER SYSTEM EMPLOYING AN ANALOG PREDISTORTION MODULE USING ZERO CROSSINGS

(75) Inventor: Richard Neil Braithwaite, Orange, CA (US)

(73) Assignee: Powerwave Technologies, Inc., Santa Ana, CA (US)

( * ) Notice: Subject to any disclaimer, the term of this patent is extended or adjusted under 35 U.S.C. 154(b) by 0 days.

(21) Appl. No.: 11/377,023

(22) Filed: Mar. 16, 2006

(65) Prior Publication Data

US 2006/0217083 A1  Sep. 28, 2006

Related U.S. Application Data

(60) Provisional application No. 60/664,098, filed on Mar. 22, 2005, provisional application No. 60/772,150, filed on Feb. 10, 2006.

(51) Int. Cl.
*H03F 1/26* (2006.01)

(52) U.S. Cl. ................................ 330/149; 455/114.3

(58) Field of Classification Search ................ 330/149; 455/114.3; 375/297
See application file for complete search history.

(56) References Cited

U.S. PATENT DOCUMENTS

| | | | |
|---|---|---|---|
| 4,700,151 A | 10/1987 | Nagata | 332/18 |
| 5,742,201 A | 4/1998 | Eisenberg et al. | 330/2 |
| 5,832,195 A | 11/1998 | Szmurlo et al. | 330/149 |
| 5,892,397 A | 4/1999 | Belcher et al. | 330/149 |
| 5,929,703 A | 7/1999 | Sehier et al. | 330/149 |
| 5,929,704 A | 7/1999 | Proctor, Jr. et al. | 330/149 |
| 6,075,411 A | 6/2000 | Briffa et al. | 330/149 |
| 6,078,216 A | 6/2000 | Proctor, Jr. | 330/151 |
| 6,236,837 B1 * | 5/2001 | Midya | 455/63.1 |
| 6,246,286 B1 | 6/2001 | Persson | 330/149 |
| 6,271,724 B1 | 8/2001 | Neffling | 330/149 |
| 6,275,106 B1 | 8/2001 | Gomez | 330/151 |
| 6,314,142 B1 | 11/2001 | Perthold et al. | 375/296 |
| 6,337,599 B2 | 1/2002 | Lee | 330/149 |
| 6,359,508 B1 | 3/2002 | Mucenieks | 330/149 |
| 6,396,345 B2 * | 5/2002 | Dolman | 330/149 |
| 6,437,644 B1 | 8/2002 | Kenington | 330/149 |

(Continued)

OTHER PUBLICATIONS

S. P. Stapleton and J. K. Cavers, "A New Technique for Adaptation of Linearizing Predistorters," Proceedings of the IEEE Vehicular Technology Conference, pp. 753-758, May 1991.

(Continued)

*Primary Examiner*—Henry Choe
(74) *Attorney, Agent, or Firm*—Myers Dawes Andras & Sherman LLP

(57) ABSTRACT

An RF amplifier system employing an analog predistortion module is disclosed. The disclosed analog predistortion module is based on zero crossings of the gain error curves (AM—AM and AM-PM curves minus DC). The hardware structure uses the product of first-order functions avoiding the need for large differential swings in the coefficients to shape the lower part of the gain curves. The higher-order nonlinear functions are preferably derived from a single envelope detector. An equal number of multipliers are preferably used in each path when the order of the magnitude and phase corrections are equal or differ by one, thus reducing delay mismatches between the magnitude and phase correction signals.

20 Claims, 10 Drawing Sheets

U.S. PATENT DOCUMENTS

| | | | |
|---|---|---|---|
| 6,476,670 B1 | 11/2002 | Wright et al. ................... 330/2 |
| 6,512,417 B2 | 1/2003 | Booth et al. ................. 330/149 |
| 6,587,513 B1 | 7/2003 | Ichihara ...................... 375/296 |
| 6,600,368 B2 | 7/2003 | Kim ............................ 330/149 |
| 6,647,073 B2 | 11/2003 | Tapio ......................... 375/297 |
| 6,707,338 B2 | 3/2004 | Kenington et al. ......... 330/149 |
| 6,741,663 B1 | 5/2004 | Tapio et al. ................. 375/297 |
| 6,757,338 B1 | 6/2004 | Kim et al. ................... 375/296 |
| 6,785,342 B1 | 8/2004 | Isaksen et al. .............. 375/284 |
| 6,856,196 B2 | 2/2005 | Okubo et al. ............... 330/136 |
| 6,882,217 B1 | 4/2005 | Mueller ......................... 330/2 |
| 6,919,764 B2 | 7/2005 | Kenington et al. ......... 330/136 |
| 6,919,765 B2 | 7/2005 | Zappala ...................... 330/149 |
| 6,949,976 B2 | 9/2005 | Funyu et al. ................ 330/292 |
| 6,963,242 B2 | 11/2005 | White et al. ................. 330/149 |
| 6,973,138 B1 | 12/2005 | Wright ........................ 375/297 |
| 6,975,167 B2 | 12/2005 | Saed ........................... 330/149 |
| 7,023,273 B2 * | 4/2006 | Johnson et al. ............. 330/149 |
| 2002/0050372 A1 | 5/2002 | Lee .............................. 375/296 |
| 2002/0171485 A1 | 11/2002 | Cova ........................... 333/149 |
| 2002/0191710 A1 | 12/2002 | Jeckeln et al. .............. 375/296 |
| 2003/0169829 A1 | 9/2003 | Velta-Coleiro ............. 375/296 |
| 2004/0132470 A1 | 7/2004 | Checoury et al. ........... 455/501 |
| 2004/0161053 A1 | 8/2004 | Cavers et al. ............... 330/151 |
| 2004/0210789 A1 | 10/2004 | Kusunoki ....................... 716/1 |
| 2005/0168283 A1 | 8/2005 | Suzuki et al. ............... 330/149 |
| 2005/0195030 A1 | 9/2005 | Okazaki et al. ............. 330/149 |

OTHER PUBLICATIONS

Wangmyong Woo, Marvin D. Miller, J. Stevenson Kenney, "A Hybrid Digital/RF Envelope Predistortion Linearization System for Power Amplifers", IEEE Transactions on Microwave Theory and Techniques, vol. 53, No. 1, Jan. 2005, pp. 229-237.

* cited by examiner

RF POWER AMPLIFIER SYSTEM EMPLOYING AN ANALOG PREDISTORTION MODULE USING ZERO CROSSINGS

RELATED APPLICATION INFORMATION

The present application claims priority under 35 USC 119(e) to provisional patent application Ser. No. 60/664,098, filed Mar. 22, 2005, and to provisional patent application Ser. No. 60/772,150, filed Feb. 10, 2006, the disclosures of which are incorporated herein by reference in their entirety.

FIELD OF THE INVENTION

The present invention relates to RF power amplifier systems. More particularly, the present invention relates to analog predistortion of a power amplifier whose input signal is modulated at the desired RF frequency.

BACKGROUND OF THE INVENTION

In wireless communications systems the power amplifier (PA) employed in base stations is a potential source of distortion. Such distortion is undesirable, especially where it causes InterModulation Distortion (IMD) components out of the spectral band allocated for the carrier since such out of band distortion is tightly regulated by the FCC (and similar bodies in other countries). One approach to reducing such distortion is to operate the amplifier in a backed off region below its maximum power capability where the amplifier is more linear. This requires a larger amplifier than would otherwise be the case, however, making the system less efficient and more expensive. This problem is made more severe by modern wide bandwidth modulation schemes, such as CDMA, WCDMA and UMTS, which employ signals with large random signal peaks. Therefore, it is highly desirable to reduce distortion while maintaining amplifier efficiency by reducing distortion without simply making the amplifier bigger. One approach to this goal is amplifier linearization using predistortion to correct for amplifier nonlinearities.

Linearization of RF power amplifiers using predistortion is a well-studied field. There are various parameters that can be used to classify predistortion approaches. One very important parameter is the form of the transmitted signal at the point where the predistortion is applied. The transmitted signal at the point where the predistortion is applied may be a digital signal, an analog intermediate frequency (IF) signal, or an analog radio frequency (RF) signal. In most approaches, it is the same form as the input signal to the system.

In digital predistortion, digital signal processing is used to generate the compensation for PA nonlinearities and the distortion they generate. When the available input signal is in a digital format, digital predistortion is a natural choice. The benefit of digital predistortion is that accurate compensation models can be created allowing for the largest amount of linearization of any of the predistortion classes. In addition, the digital predistortion approaches match well with adaptive systems whose coefficient estimation is performed digitally. The primary disadvantage of digital predistortion is that the available input signal is often RF, and it would cause excessive delay and cost to down-convert and digitize the available signal. Therefore, there is a broad class of amplifier applications where analog predistortion is the only practical approach.

Analog predistortion approaches may in turn use digital processing by deriving a baseband signal from the input analog signal envelope, performing an analog to digital conversion, performing the digital baseband processing to derive digital predistortion signals, converting the digital predistortion signals to analog form, then applying the analog predistortion signals to the input signal to predistort the signal. This approach suffers from undesirable time delays in the parallel predistortion path to allow time for the digital baseband processing. This requires large delay lines in the main signal path introducing undesirable power losses and system size, weight and cost. Analog predistortion approaches may alternatively use analog processing to derive predistortion signals. Such approaches, however, have suffered from a lack of ability to sufficiently accurately model the predistortion needed to correct the amplifier nonlinearities. This is particularly the case for large modulation bandwidths and high peak to average signals of the type noted above which are commonly employed in many modern communications systems.

Accordingly a need presently exists for a predistortion approach which can address the above noted problems and provide effective amplifier linearization employing analog predistortion where digital predistortion is not practical.

SUMMARY OF THE INVENTION

In a first aspect the present invention provides a linearized power amplifier system comprising an input, receiving an analog communication signal, and a main signal path comprising a power amplifier and a delay circuit and a vector modulator coupled between the input and the power amplifier. An output is coupled to the output of the power amplifier. A signal splitter is coupled to the input and provides a sampled input signal on a parallel signal path to the main signal path. An analog baseband predistortion module is configured in the parallel signal path and receives the sampled input signal. The analog baseband predistortion module performs an analog predistortion operation employing the sampled input signal and zero crossing coefficients characterizing nonlinearity in the amplifier gain response and provides in phase and quadrature predistortion control signals to the vector modulator in the main signal path to predistort the input signal to correct for amplifier nonlinearity.

In a preferred embodiment of the linearized power amplifier system the analog baseband predistortion module comprises an envelope detector providing an analog envelope signal corresponding to the input signal envelope and a zero crossing specification circuit performing the predistortion operation on the analog envelope signal using the zero crossing coefficients. The linearized power amplifier zero crossing specification circuit preferably comprises a first plurality of addition circuits receiving zero crossing coefficients corresponding to the amplitude response of the amplifier and a second plurality of addition circuits receiving zero crossing coefficients corresponding to the phase response of the amplifier. The linearized power amplifier system zero crossing specification circuit further comprises a plurality of multiplier circuits coupled to the first plurality of addition circuits and one or more multiplier circuits coupled to the second plurality of addition circuits. In a preferred embodiment of the linearized power amplifier system the first plurality of addition circuits comprises three addition circuits coupled in parallel to the envelope detector, each receiving a zero crossing coefficient, and two multiplier circuits are coupled to the first plurality of addition circuits.

The second plurality of addition circuits preferably comprises two addition circuits coupled in parallel to the envelope detector, each receiving a zero crossing coefficient, and one multiplier circuit is coupled to the second plurality of addition circuits.

In a preferred embodiment of the linearized power amplifier system the analog baseband predistortion module further comprises a scale and offset circuit for adjusting magnitude and phase scale and offset. The linearized power amplifier scale and offset circuit preferably comprises a multiplier receiving a magnitude scaling factor, a multiplier receiving a phase scaling factor, an addition circuit receiving a magnitude offset factor, and an addition circuit receiving a phase offset factor. In an adaptive embodiment, the linearized power amplifier system further comprises a second signal splitter, coupled to the output and providing a sampled output signal, and an estimator, coupled to receive the sampled input signal and sampled output signal, and providing the zero crossing coefficients to the analog baseband predistortion module on an adaptive basis. The linearized power amplifier system input signal may be a wide bandwidth modulated communication signal selected from the group consisting of CDMA, WCDMA and UMTS modulated RF communication signals.

According to another aspect the present invention provides a linearized power amplifier system comprising an input, receiving an analog communication signal, and a main signal path comprising a power amplifier, and a delay circuit, a magnitude adjuster and a phase adjuster coupled between the input and the power amplifier. An output is coupled to the output of the power amplifier. A signal splitter is coupled to the input and provides a sampled input signal on a parallel signal path to the main signal path. An analog baseband predistortion module is configured in the parallel signal path and receives the sampled input signal. The analog baseband predistortion module performs an analog predistortion operation employing the sampled input signal and zero crossing coefficients characterizing nonlinearity in the amplifier gain response and provides a magnitude adjuster control signal to the magnitude adjuster in the main signal path and a phase adjuster control signal to the phase adjuster in the main signal path to predistort the input signal to correct for amplifier nonlinearity.

According to another aspect the present invention provides a method for predistortion linearization of a power amplifier system. The method comprises receiving an input communication signal, splitting the input communication signal into a main input signal and a sampled input signal, and providing the main input signal to a power amplifier. The method further comprises detecting the sampled input signal envelope, generating predistortion control signals using the product of first-order functions of the sampled input signal envelope offset by zero crossing coefficients, and applying the predistortion control signals to the main input signal prior to the amplifier to predistort the main input signal to compensate for nonlinearities in the power amplifier gain response.

In a preferred embodiment of the method for predistortion linearization of a power amplifier system the predistortion control signals correspond to the inverse complex gain of the power amplifier. The zero crossing coefficients preferably correspond to DC offsets at the locations of the intersection of a fixed AM—AM response with the actual AM—AM response curve of the power amplifier. The zero crossing coefficients preferably further correspond to DC offsets at the locations of intersection of a fixed AM-PM response with the actual AM-PM response curve of the power amplifier. Applying the predistortion control signals to the main input signal preferably comprises modulating the main input signal employing a vector modulator controlled by the predistortion control signals. The predistortion control signals may comprise magnitude and phase control signals. The method may further comprise sampling the output of the power amplifier and adaptively estimating the zero crossing coefficients using the sampled input and sampled output signals. The method preferably further comprises delaying the main input signal prior to applying the predistortion control signals to the main input signal. The input signal may be a wide bandwidth modulated communication signal selected from the group consisting of CDMA, WCDMA and UMTS modulated RF communication signals.

Further features and advantages of the present invention are set out in the following detailed description.

DETAILED DESCRIPTION OF THE INVENTION

Figure 1:
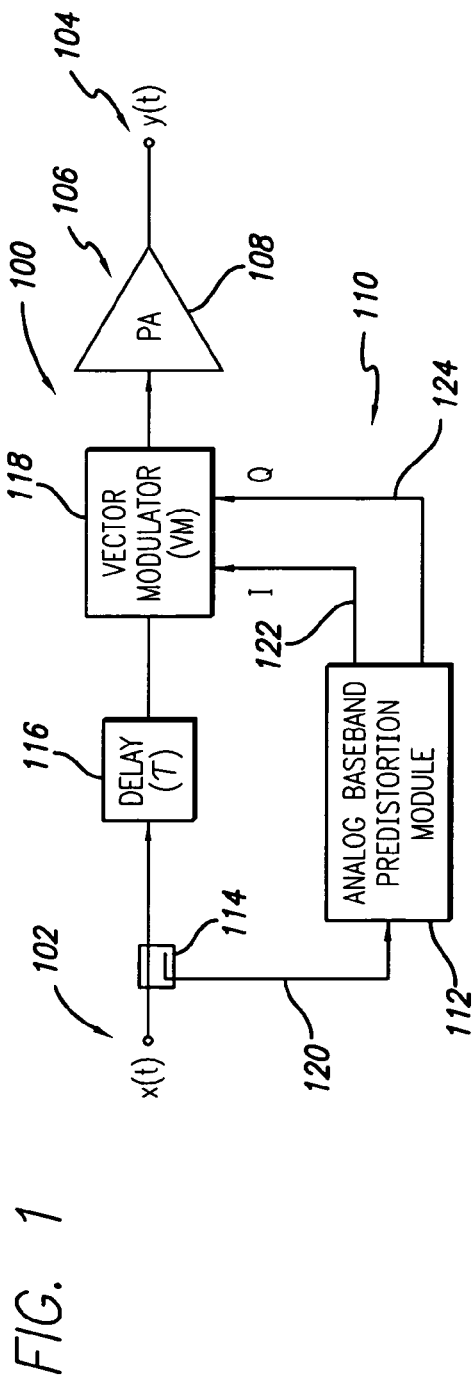
FIG. 1 is a block schematic drawing of a power amplifier system employing analog predistortion using gain correction, implemented using a vector modulator (VM), in accordance with a first embodiment of the present invention.
Figure 2:
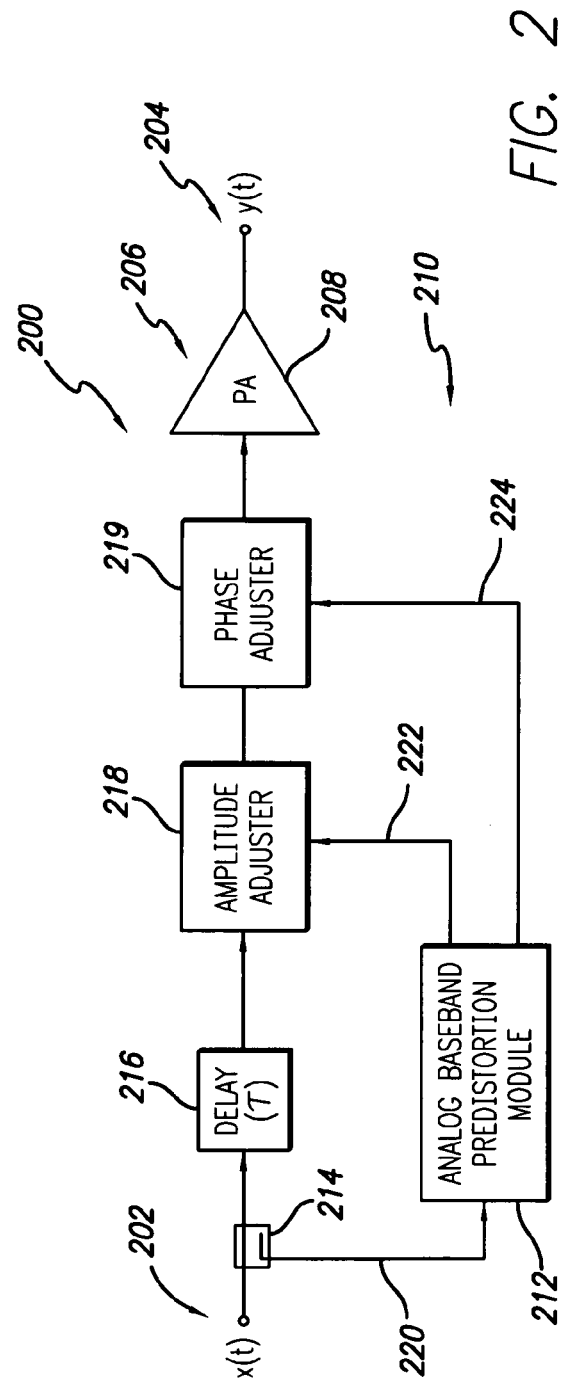
FIG. 2 is a block schematic drawing of a power amplifier system employing analog predistortion using gain correction, implemented using separate amplitude and phase adjusters, in accordance with a second embodiment of the invention.

One embodiment of a predistortion linearized amplification system employing analog predistortion is shown in FIG. 1. The predistortion compensates for gain and phase variations in the power amplifier (PA) using a vector modulator (VM) controlled by an analog baseband signal. Alternatively, in a different approach compensation can be achieved using separate adjustments for amplitude and phase, such as a variable voltage control attenuator (VVA) and phase shifter (PHS), respectively, as shown in FIG. 2.

Referring to FIG. 1, the amplification system 100 includes an input 102 which receives an analog communication signal, for example, a wide bandwidth modulated RF signal such as a CDMA, WCDMA or UMTS signal, which is provided along a first main signal path 106 to a power amplifier 108 which provides the amplified signal to output 104. As discussed above, if uncorrected the power amplifier 108 will introduce distortion into the output signal, especially for large peak input signals. The analog input signal is also provided to a second parallel predistortion path 110 via a coupler 114. The parallel path 110 includes an analog baseband predistortion module 112 which receives the sampled analog input signal along line 120 and performs an analog predistortion operation described in more detail below. The main signal path 106 also includes a delay circuit 116 which matches the delay in the parallel predistortion path 110, and a vector modulator 118 which receives in phase (I) and quadrature (Q) predistortion signals along lines 122 and 124, respectively, which predistortion signals correct for nonlinearities introduced by power amplifier 108. As a result, the amplified output signal provided at output 104 is a linearized signal with substantially less distortion than without predistortion linearization.

Figure 3:
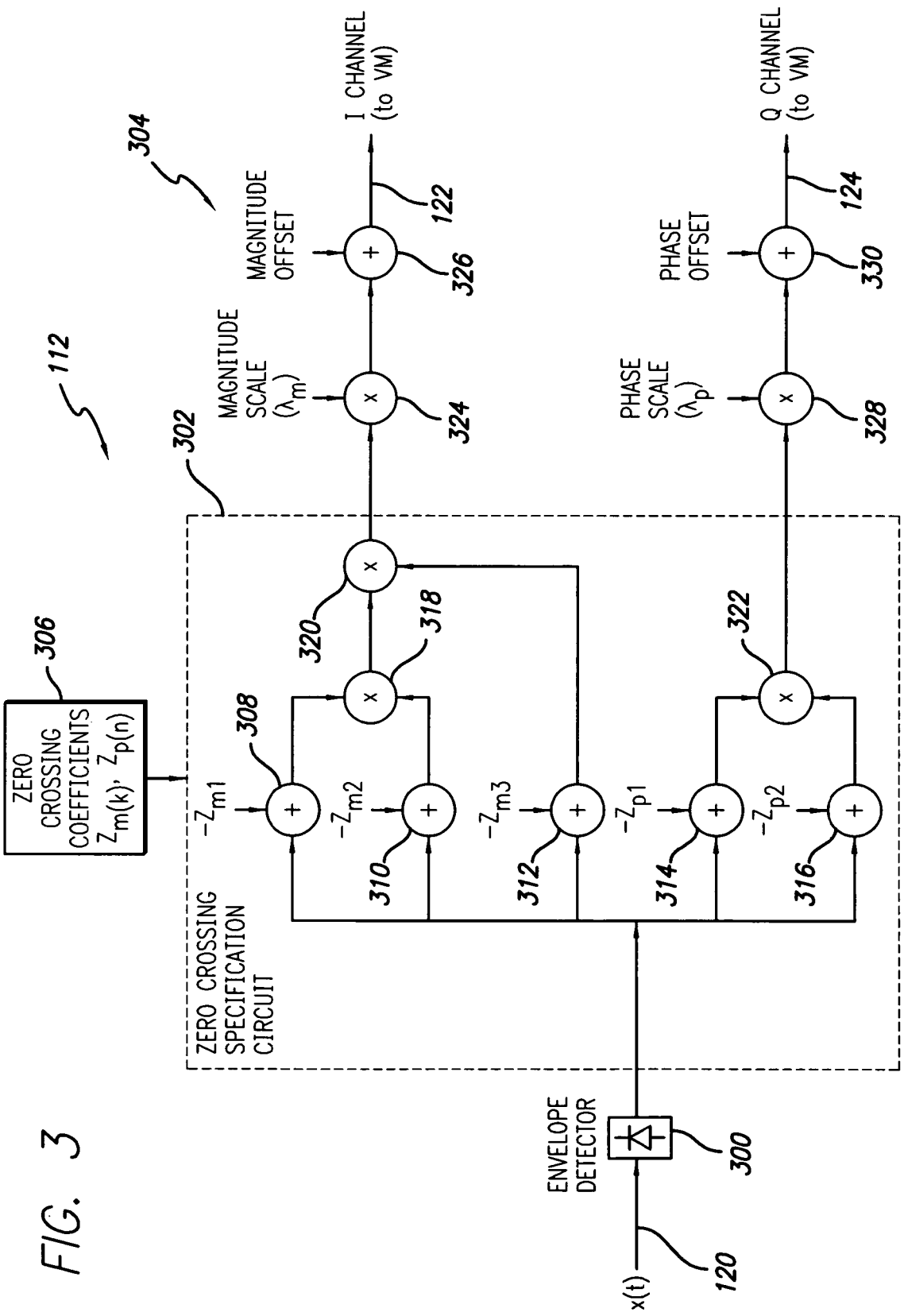
FIG. 3 is a schematic drawing of the analog baseband predistortion module of the present invention adapted for the embodiment of FIG. 1.

A preferred embodiment of the analog baseband predistortion module 112 is shown in FIG. 3. As shown an envelope detector 300 receives the sampled input RF signal along line 120 and provides an analog baseband signal corresponding to the input signal envelope. (Alternatively, an analog IF signal may be provided along line 120 using a local oscillator and mixer to convert the sampled RF signal to IF, in a manner well known to those skilled in the art.) The baseband predistortion signals are derived from the product of first-order terms of the input signal magnitude. The first-order terms are referred to herein as "zero crossings" and are created in zero crossing specification circuit 302 as shown. The zero crossing specification circuit 302 receives zero crossing coefficients $z_{m(k)}$; $z_{p(n)}$ from a suitable coefficient source 306, as also shown. The coefficient source 306 may be an adaptive estimator as described below (in relation to FIGS. 6–9) or may be a suitable storage having stored coefficients determined from amplifier measurements. (If the stored coefficients are in digital form storage 306 will include a DAC.) In general, the position and number of zero crossings required to model the magnitude and phase components of the PA gain (or its inverse gain) are different. As shown by the preferred implementation of FIG. 3, the zero crossing specification circuit 302 may advantageously be a relatively simple circuit having associated a relatively short delay time. The short delay time has the significant advantage of requiring only a short delay in the delay 116 in the main signal path. More specifically, as shown the circuit may comprise a simple configuration of addition circuits and multipliers. In particular, the specific implementation comprises first, second and third addition circuits 308, 310, 312 receiving the magnitude zero crossing coefficients, which are respectively output to multipliers 318 and 320. Similarly fourth and fifth addition circuits 314, 316 receive the phase zero crossing coefficients, outputs of which are provided to multiplier 322.

In addition, scale and offset terms are specified for each of the magnitude and phase corrections in circuit 304. When a vector modulator is used to inject the baseband predistortion, the phase offset is set to zero so that the magnitude and phase correction can be connected to the I and Q channels of the vector modulator, respectively. (If the magnitude and phase corrections are applied using a separate gain adjuster and phase shifter, as discussed later, any offsets can be specified.)

Figure 4:
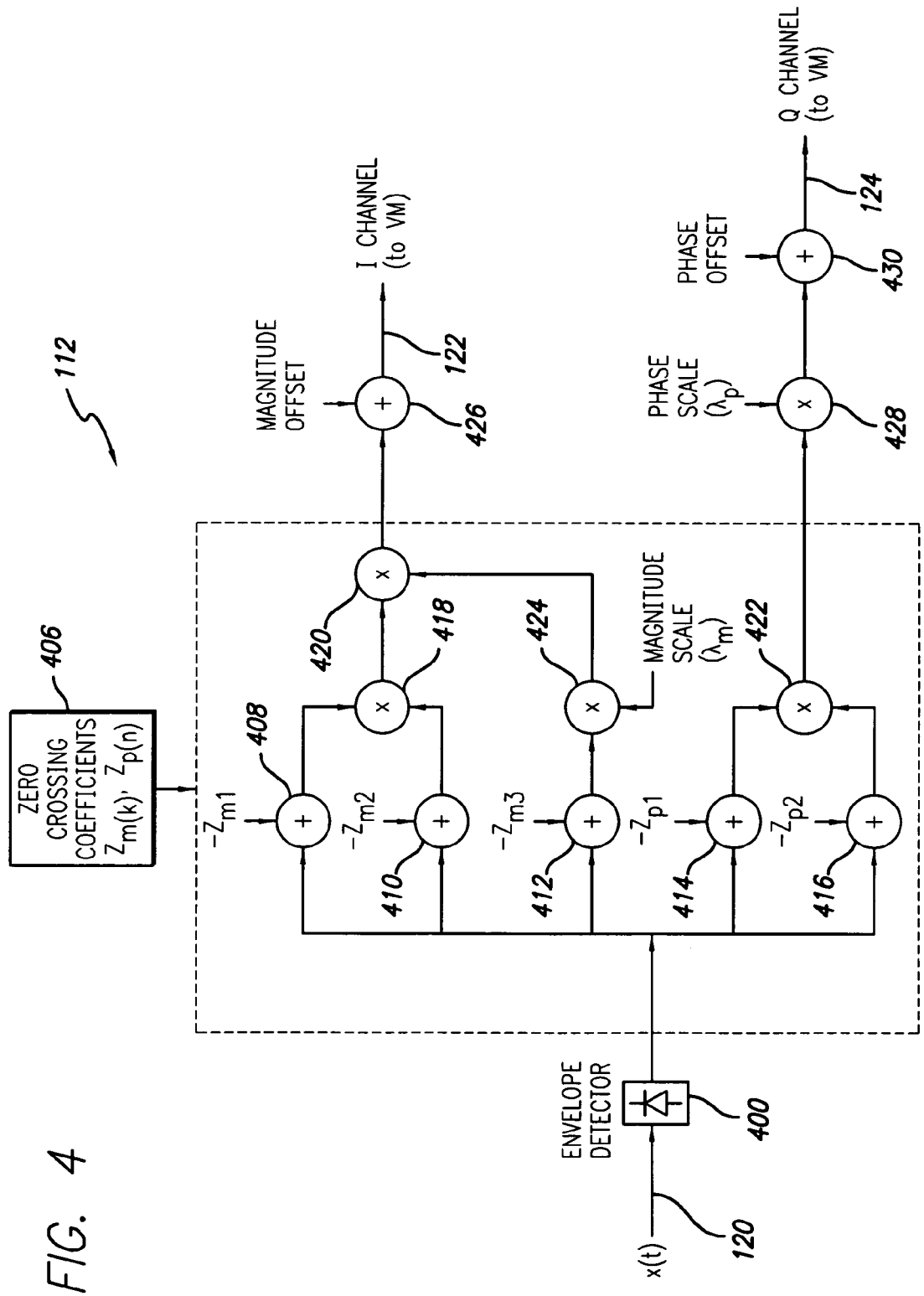
FIG. 4 is a schematic drawing of an alternate embodiment of the baseband predistortion module adapted for the embodiment of FIG. 1.

FIG. 4 is a schematic drawing of an alternate embodiment of the analog baseband predistortion module 112 adapted for the embodiment of FIG. 1. The magnitude scale term is applied earlier to delay match each of the signal paths within the magnitude and phase correction. When the predistortion uses a vector modulator, the magnitude and phase (I and Q) correction must be aligned in time. Within FIG. 4, the magnitude correction is modified to time-align each of its paths with the phase correction. By applying the magnitude scale term earlier, at multiplier 424, the number of multipliers in each path is made equal despite having an additional zero crossing on the magnitude correction. Otherwise the operation of circuit 112 in FIG. 4 is the same as that in FIG. 3 and the individual circuit components match those of FIG. 3 and need not be described further.

Referring to FIG. 2, a system employing a different approach to predistortion compensation is shown which uses separate adjustments for amplitude and phase. The amplification system 200 includes an input 202 which receives an analog communication signal, for example, of a type as described above, which is provided along a first main signal path 206 to a power amplifier 208 which provides the amplified signal to output 204. The analog input signal is also provided to a second parallel predistortion path 210 via a coupler 214. The parallel path 210 includes an analog baseband predistortion module 212 which receives the sampled analog input signal along line 220 and performs an analog predistortion operation described in more detail below. The main signal path 206 also includes a delay circuit 216 which matches the delay in the parallel predistortion path 210, and separate magnitude and phase adjusters 218, 219 which receive magnitude and phase predistortion signals along lines 222 and 224, respectively, which predistortion signals correct for nonlinearities introduced by power amplifier 208. Magnitude adjuster 218 may be a voltage variable attenuator (VVA) and phase adjuster 219 may be a known voltage adjustable phase shifter (PHS). The amplified output signal provided at output 204 is a linearized signal with substantially less distortion than without predistortion linearization.

Figure 5:
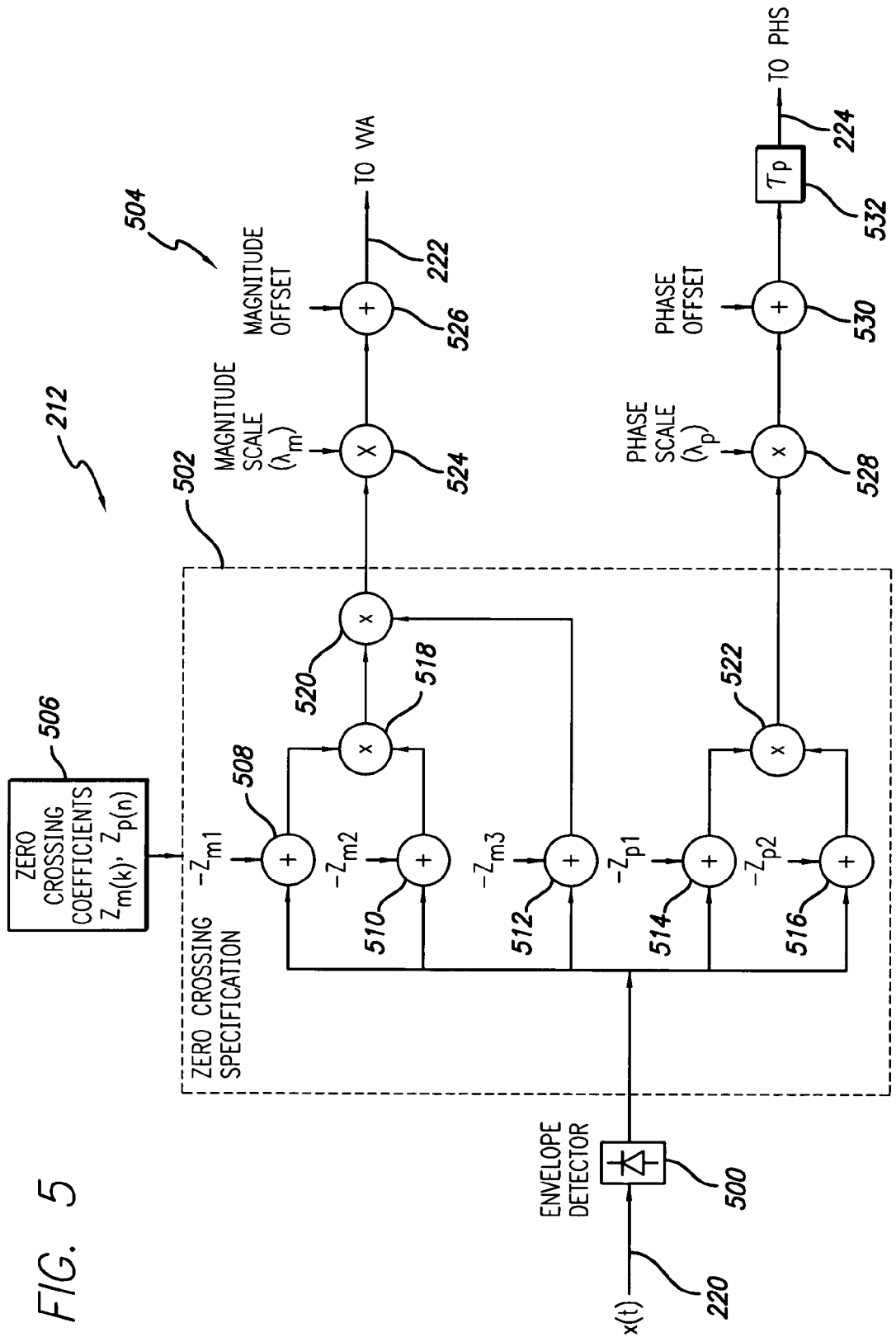
FIG. 5 is a schematic drawing of an alternate embodiment of the analog baseband predistortion module adapted for the embodiment of FIG. 2.

FIG. 5 is a schematic drawing of an alternate embodiment of the analog baseband predistortion module adapted for the embodiment of FIG. 2 (when separate VVA and PHS devices are used). The phase correction is delayed to compensate for propagation differences in the main signal path and response differences between the VVA and PHS. As shown an envelope detector 500 receives the sampled input RF signal along line 220 and provides an analog baseband signal corresponding to the input signal envelope. The zero crossing specification circuit 502 receives zero crossing coefficients $z_{m(k)}$; $z_{p(n)}$ from a suitable source 506, as also shown. The zero crossing specification circuit 502 comprises addition circuits 508, 510, and 512 receiving the magnitude zero crossing coefficients, which are respectively output to multipliers 518 and 520, as shown. Similarly addition circuits 514, 516 receive the phase zero crossing coefficients, outputs of which are provided to multiplier 522. In addition, scale and offset terms are specified for each of the magnitude and phase corrections in circuit 504. When separate magnitude and phase adjusters (VVA and PHS) are used to apply predistortion to the main signal path (see FIG. 2), the delay requirements for the magnitude and phase correction differ (in general). Since the VVA and PHS are connected in series, the input signal at the latter adjuster is subjected to an additional delay. In addition, the VVA and PHS devices may have difference responses (time constants) to their respective control signals. As a result, a delay may be required on either the magnitude or phase control signal path. The latter case is shown in FIG. 5 by delay circuit 532. It should be apparent to those skilled in the art that the magnitude path would be delayed if the order of the VVA and PHS in FIG. 2 are interchanged or if differences in the device time constants warrant it. A delay on either the magnitude or phase may also be necessary when the number of multipliers in series within the magnitude and phase correction paths differ; (this requirement applies to both the vector modulator and separate VVA-PHS implementations).

The zero crossing coefficients and scale terms are selected to linearize the power amplifier system. Improved linearity minimizes the distortion at the output of the PA and makes the AM—AM and AM-PM curves of the combined predistortion and PA system constant over the range of input power levels (see FIGS. 10A and 10B discussed below). The DC offset added to the magnitude correction controls the nominal gain of the system. The phase offset is set to zero when using a vector modulator. (Note that a zero phase offset may correspond to a non-zero voltage if a bias voltage is required by the vector modulator).

There are many advantages to the zero crossing implementation of the baseband predistortion module. Analog multipliers used to multiply analog signals are non-ideal in the sense that voltage offsets exist. The zero crossing implementation is less sensitive to such offsets than other analog predistortion approaches employing analog multipliers, and in particular analog polynomial-based predistortion approaches. Since the zero crossing coefficients themselves are DC offsets, an input voltage offset can be corrected directly by the tuning of the zero crossings. Output voltage offsets can be corrected using either the magnitude or phase offset coefficients.

The zero crossing implementation also has better control of the AM—AM and AM-PM curves at the lower input magnitude levels than in an analog polynomial based implementation. The polynomial implementation is a Taylor series expansion about zero. As a result, to alter the shape of the curves near a zero input, the difference of polynomial basis functions is required. In some cases a small difference is required from a pair of signals with a large common-mode component making the dynamic range required for the coefficients weighting the basis function extremely large. This coefficient sensitivity becomes a larger problem when the above-mentioned voltage offsets in the analog multipliers are considered. In contrast, the dynamic range requirement for the zero crossing implementation is far less. Other advantageous features of the invention will be appreciated by those skilled in the art.

Figure 6:
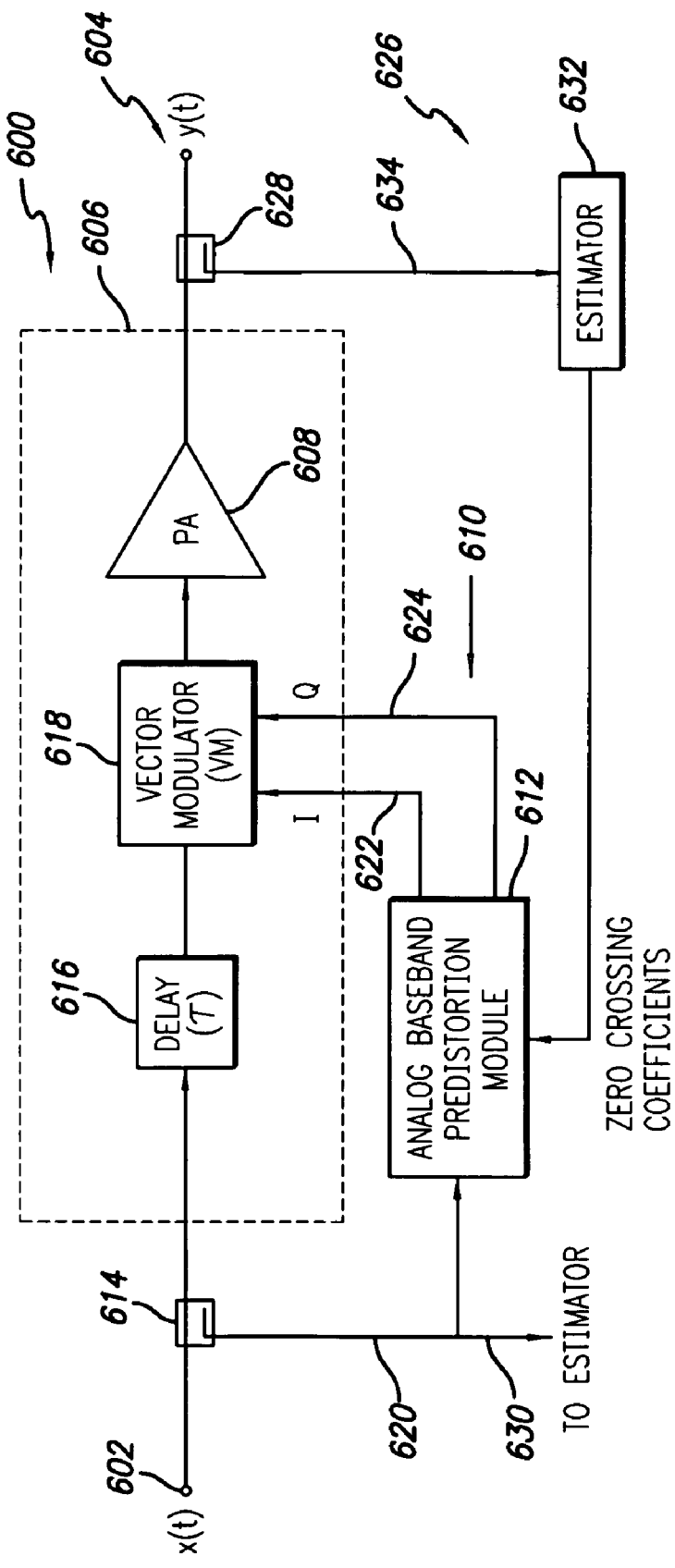
FIG. 6 is a block schematic drawing of a power amplifier system employing adaptive analog predistortion in accordance with the present invention.

Referring next to FIG. 6, an adaptive implementation of the linearized power amplifier system will be described. The analog predistortion approach described above can be made adaptive by adjusting the coefficients automatically to optimize the performance based on measurements of the system. The adjustable coefficients of the baseband predistortion include, typically, the position of the zeros, scale terms, and offsets. The performance of the predistortion is judged based on measurements of the complex gain (magnitude and phase) of the system or on the energy measured in key portions of the output signal spectrum. As shown in FIG. 6, the adaptive system includes a main signal path 606, coupled between the input 602 and output 604, and a parallel predistortion signal path 610. Both signal paths may correspond to the previous described embodiments and include coupler 614, delay 616, vector modulator 618 and power amplifier 608 in the main path 606, and analog baseband predistortion module 612 in the parallel path 610. In addition a third signal path 626 is coupled to both the input 602, via coupler 614, and to the output via coupler 628, to provide an adaptive capability to the overall system. The adaptive signal path 626 includes an estimator 632, preferably implemented using a DSP, which is used to generate coefficient adjustments that, on average, will improve the performance. The measurements are made, preferably, on RF signals coupled from the input and output of the system, provided along lines 630, 634 as shown in FIG. 6.

The measurements can be obtained by down-converting and sampling of the input and output signals, detecting the gain of the system, or detecting spurious energy within a narrow bandwidth of the output signal spectrum. The three configurations corresponding to these embodiments are shown in FIG. 7, FIG. 8, and FIG. 9, respectively.

Figure 7:
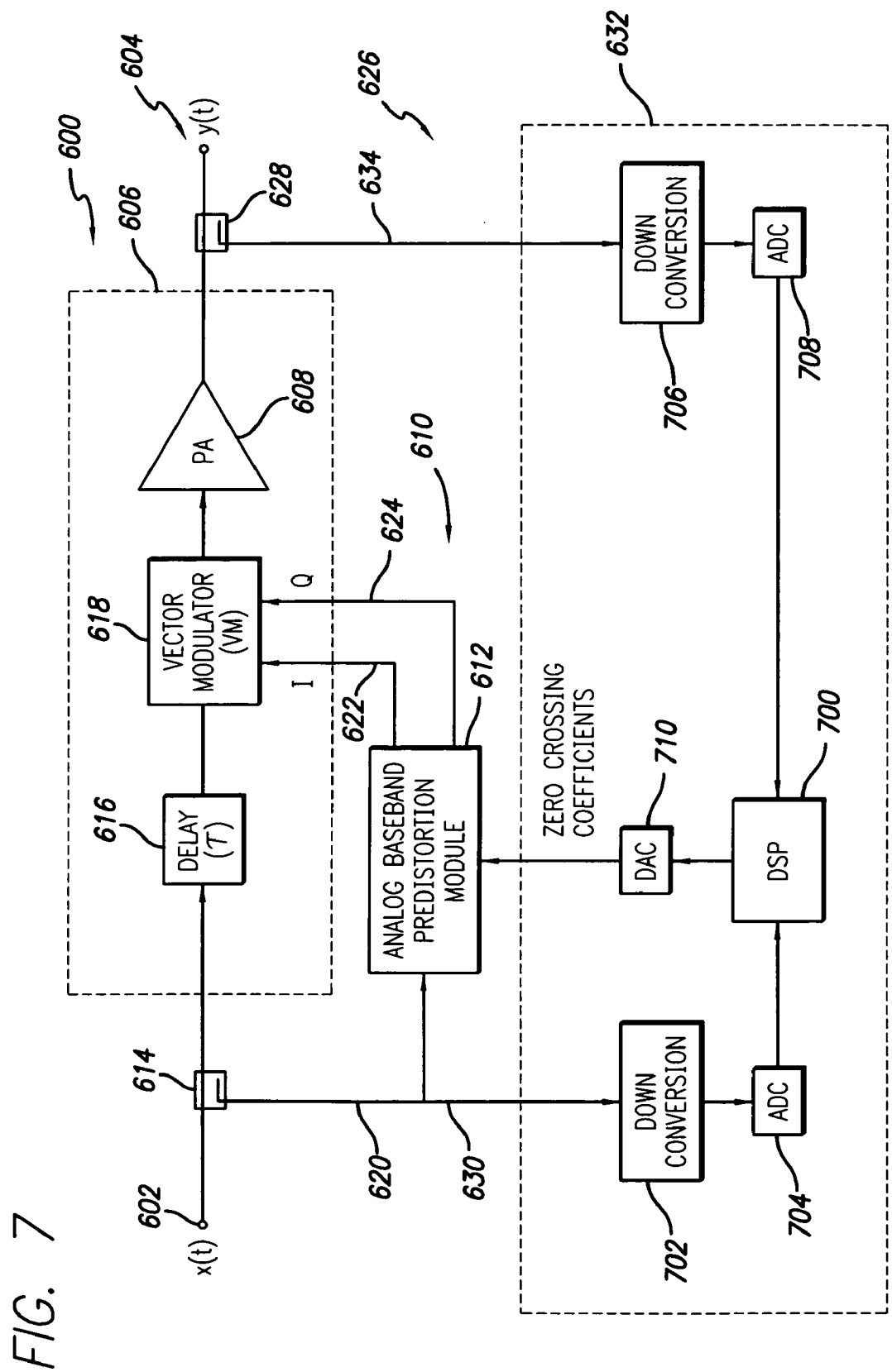
FIG. 7 is a block schematic drawing of a power amplifier system employing adaptive analog predistortion in accordance with a specific embodiment of the present invention employing sampling of the input and output signals.

Referring to the embodiment of FIG. 7, to sample the input and output, the RF signals are down-converted to baseband or an intermediate frequency (IF) at down conversion circuits 702, 706. The signals are then converted from analog to digital using ADC's 704, 708. The digital input and output sequences are processed in DSP 700 to time-align the sequences and to determine the residual nonlinearity within the system. Coefficient adjustments are generated with the goal of reducing the nonlinearity and are provided in analog form to the predistortion module 612 via DAC 710. Note that the sampling rate can be less than the Nyquist rate when the nonlinearity can be approximated as memoryless. This allows a less expensive DSP to be employed reducing overall system costs.

Figure 8:
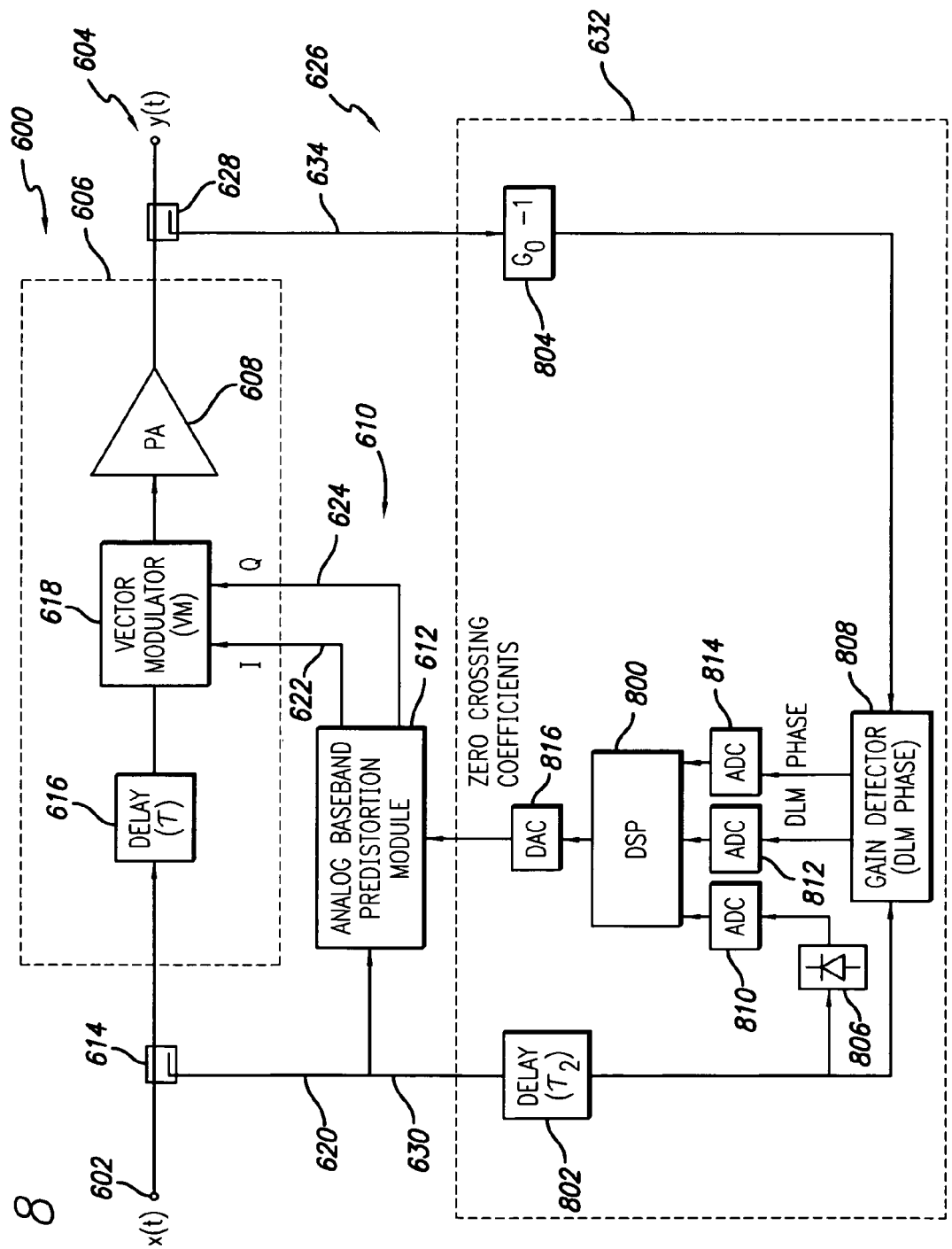
FIG. 8 is a block schematic drawing of a power amplifier system employing adaptive analog predistortion in accordance with another specific embodiment of the present invention employing detection of the differential log-magnitude and phase using a gain detector.

Referring to the embodiment of FIG. 8, detection of the gain of the system preferably uses, for example, differential log-magnitude (DLM) and phase detectors 808 that measure the RF signals directly. Such detectors are commercially available as well known to those skilled in the art. The input and output signals should be time-aligned at the DLM and phase detectors 808, which is achieved preferably by delaying the input signal with delay 802. It is also preferable that the input and output signals have the same nominal power at the detectors; this is accomplished, preferably, by attenuating the output signal sample with attenuator 804. The analog outputs of the detectors are converted to digital samples at ADCs 812, 814. It is beneficial, but not essential, to digitally sample the magnitude (or power) of the input signal from envelope detector 806 using an ADC 810. The required time-alignment of the magnitude of the input signal with the detected DLM and phase can be performed before or after digital conversion. The DLM, phase, and input magnitude sequences are processed in DSP 800 to determine the residual nonlinearity within the system. Coefficient adjustments are generated with the goal of reducing the nonlinearity and are provided in analog form to the predistortion module 612 via DAC 816. Note that the sampling rate can be low when the nonlinearity can be approximated as memoryless. Also note that the differential log-magnitude can be replaced by the ratio of the output and input magnitudes.

Figure 9:
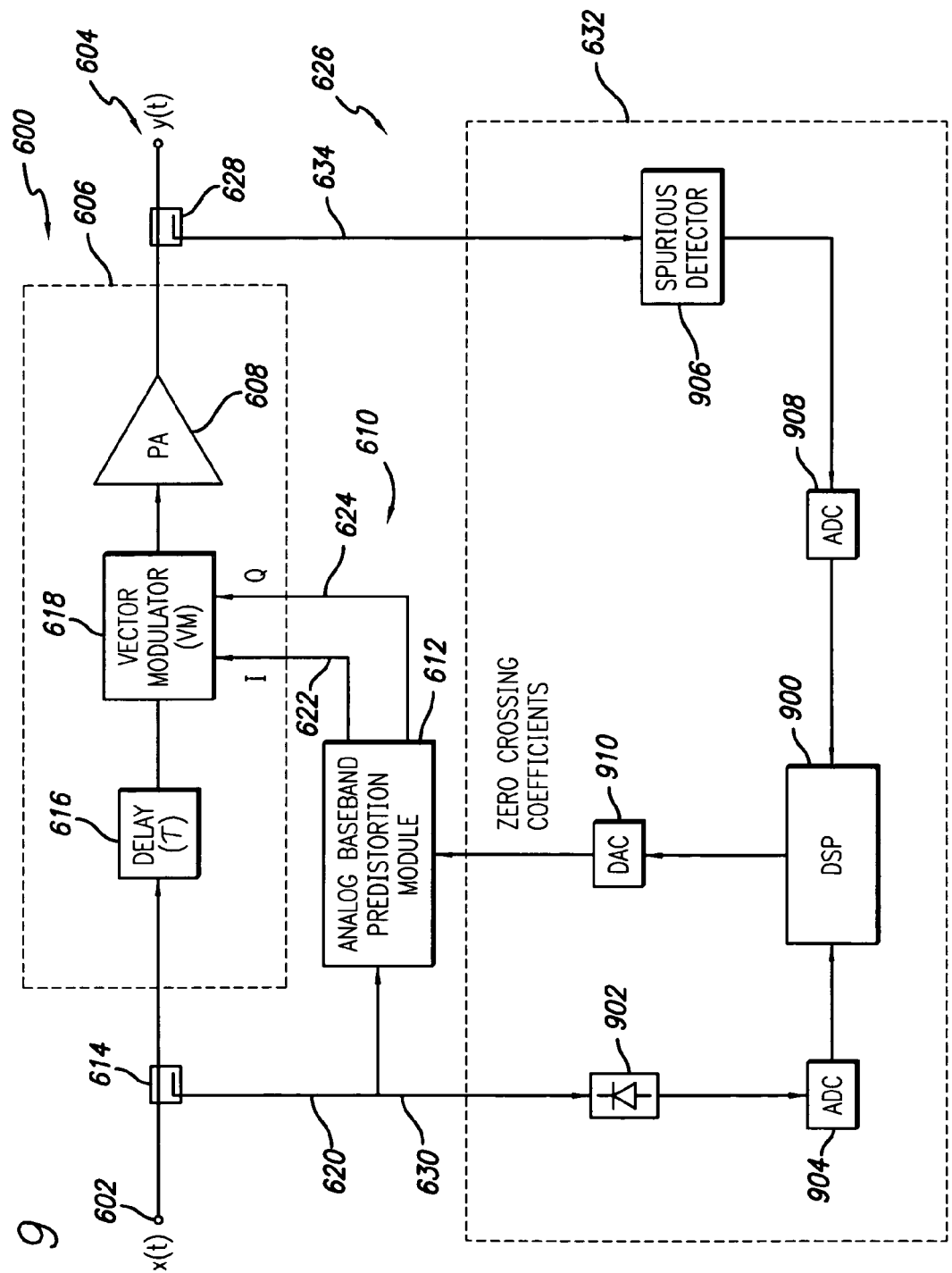
FIG. 9 is a block schematic drawing of a power amplifier system employing adaptive analog predistortion in accordance with another specific embodiment of the present invention employing narrow bandwidth sampling using a spurious detector.

Referring to the embodiment of FIG. 9, the nonlinearity of the system can be gauged by measuring spectral energy appearing outside of the linear signal bandwidth in portions of the spectrum typically populated by intermodulation distortion. A spurious detector 906 in the adaptation path 626 is used to measure spectral power within a narrow bandwidth. One implementation of a spurious detector is shown in U.S. Pat. No. 6,140,874 to French et al; the disclosure of which is incorporated herein by reference in its entirety. The bandwidth and center frequency of the spurious detector are selected to notch the linear input signal and detect the intermodulation distortion. The analog output of the spurious detector is converted to digital samples at ADC 908. It is beneficial, but not essential, to digitally sample the magnitude (or power) of the input signal output from envelope detector 902 using ADC 904. Time-alignment of the magnitude of the input signal with the detected spurious signal can be performed before or after digital conversion. The spurious energy and input magnitude sequences are processed in a DSP 900 to determine the residual nonlinearity within the system. Coefficient adjustments are generated with the goal of reducing the nonlinearity and are provided in analog form to the predistortion module 612 via DAC 910.

Various known adaptation approaches may be employed, including LMS techniques. It may be difficult to estimate the zero crossing positions using standard LMS techniques. It is possible to use a polynomial basis for the estimation, converting the polynomial into zeros later. When the zero positions are specified, LMS estimation is then applied to obtain the scale and offset terms. The zero crossing positions may be refined using other iterative search techniques after the initial estimate from the polynomial basis set. Additional adaptation considerations will be appreciated from the following discussion.

Next the theory of operation will be described in more detail. As will be appreciated by those skilled in the art, the following discussion follows directly from the above description and figures.

Figure 10A:
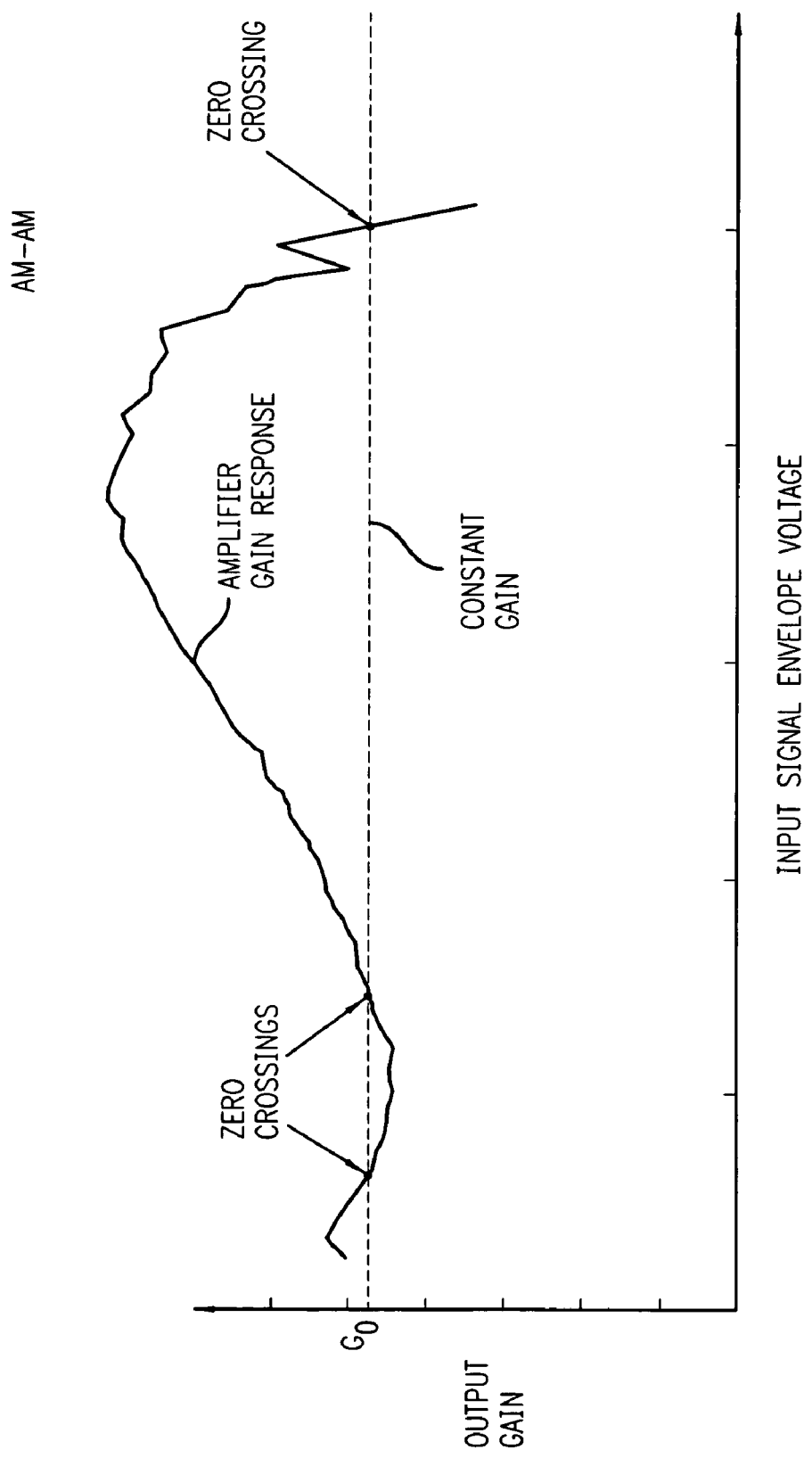
FIGS. 10A and 10B are graphical representations of the gain phase response of a power amplifier (AM—AM and AM-PM curves) illustrating zero crossings.
Figure 10B:
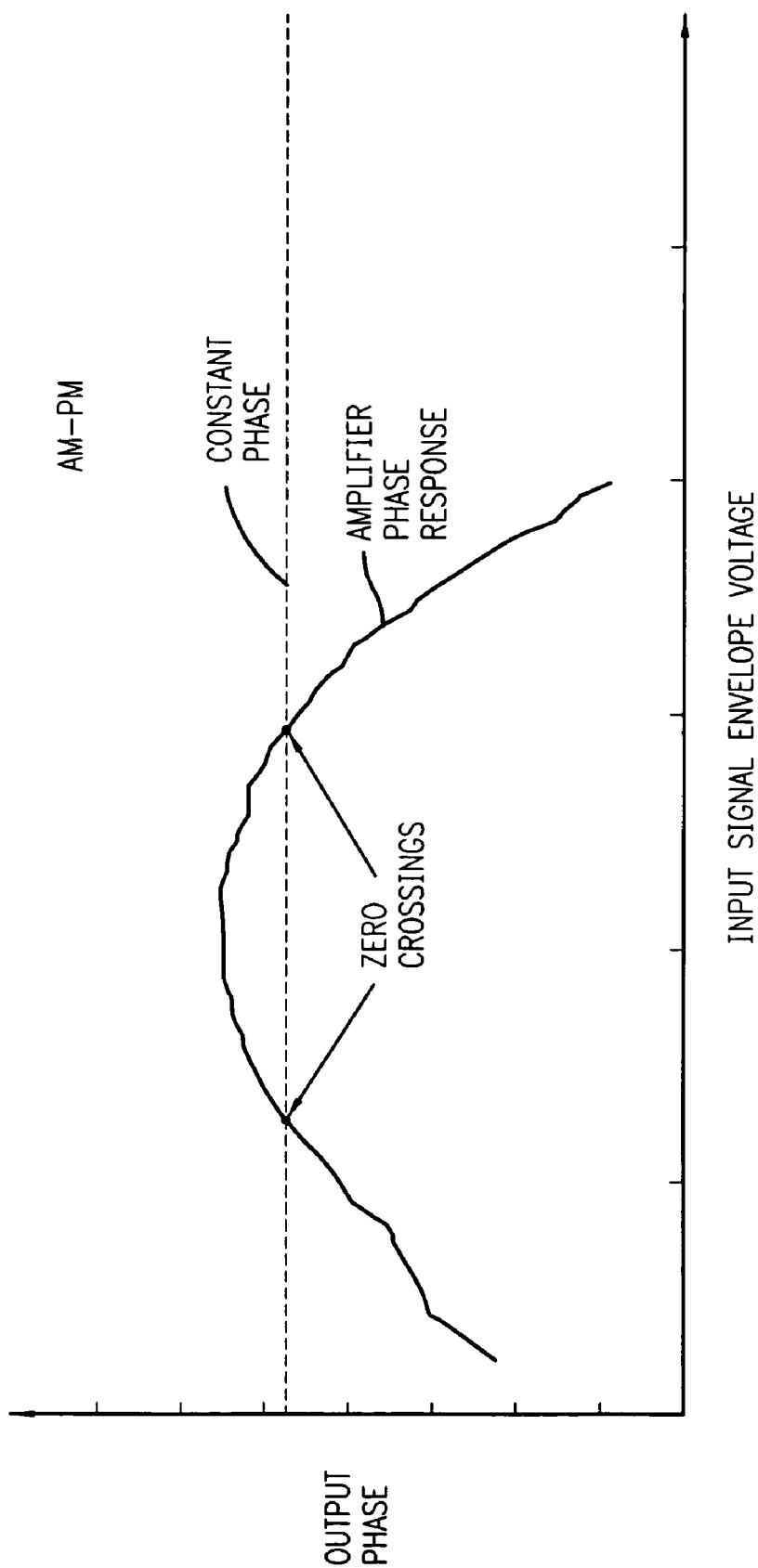

The above disclosed predistortion approach is preferably employed to compensate for distortion generated by memoryless nonlinearities within the RF amplification path. Memoryless nonlinearities are often described using AM—AM and AM-PM curves where the amplitude and phase components of the system gain are plotted as a function of the input envelope, $|x(t)|$. Illustrative AM—AM and AM-PM curves for the PA, without predistortion are shown in FIGS. 10A and 10B, respectively. The uncorrected AM—AM and AM-PM curves are useful for determining the order of the predistortion. Consider the AM—AM curve (FIG. 10A). The ideal predistortion causes the AM—AM of the system to be flat over the range of input envelopes. Assume a DC level is chosen representing the desired gain of the system, denoted by $G_o$. The uncorrected AM—AM curve will intersect the DC level at various envelope voltages. These intersection points are referred to herein as "zero crossings" (although level crossing may also be considered an appropriate description and may alternatively be employed herein). The number of zero crossings defines the order. In this case, the magnitude has three zero crossings and the phase has two. (Note that the order of the gain nonlinearity is one less than RF distortion. A second order phase produces a third-order IMD).

The AM component of the system gain is $$|G_{sys}(|x|)|=|G_{PA}[abs\{G_{VM}(|x|)\}]| \quad (1)$$

where $G_{VM}$ and $G_{PA}$ are the gains of the vector modulator and PA, respectively. To flatten the system's AM—AM curve, amplitude adjustments provided by the vector modulator must stretch and compress the horizontal axis of the PA's AM—AM curve except at the input envelope voltages $|x|$ that correspond to the zero crossings. Thus, the zero crossings of the PA amplitude component are the same as the zero crossings of the VM despite the fact the respective AM curves are approximately inverses of each other. The structure of the baseband predistortion module preferably exploits this invariance by using the zero crossings as adaptable coefficients.

The PM component of the system gain is $$\arg\{G_{sys}\}=\arg\{G_{PA}[abs\{G_{VM}(|x|)\}]\}+\arg\{G_{VM}(|x|)\}. \quad (2)$$

The above-mentioned invariance of the zero crossings does not extend to the AM-PM curves because the amplitude of the VM affects the phase of the PA. The zero crossing structure can still be used to represent the phase correction of the VM; however the zero crossings will be slightly different than those of the PA. The predistortion gain provided by the vector modulation is $$G_{VM} = 1 + \lambda_m \prod_k (|x| - z_{m(k)}) + j\lambda_p \prod_n (|x| - z_{p(n)}) \quad (3)$$

where $\lambda_m$ and $\lambda_p$ are scale terms for the magnitude and phase correction; $z_{m(k)}$ and $z_{p(n)}$ are the zero crossings of the VM's AM—AM and AM-PM responses. The analog baseband predistortion module for the case of three magnitude and two phase zero crossings is shown in FIGS. 3 and 4 discussed above. The DC offset added to the magnitude correction controls the nominal gain of the VM. The phase offset is preferably set to zero.

If $|\lambda_m|$ and $|\lambda_p|$ are small compared to unity, equation (3) can be rewritten in terms of log-magnitude and phase, which are the measurement units of the gain detector 808 shown in FIG. 8:

$$\log\{|G_{VM}|\} \approx \lambda_m \cdot \prod_k (|x| - z_{m(k)}) \quad (4)$$

$$\arg\{G_{VM}\} \approx \lambda_p \cdot \prod_n (|x| - z_{p(n)}). \quad (5)$$

The coefficients ($\lambda_m$, $z_{m1}$, $z_{m2}$, $z_{m3}$, $\lambda_p$, $z_{p1}$, $z_{p2}$ in FIGS. 3 and 4) are adapted to linearize the PA, making the AM—AM and AM-PM curves of the system constant. The adaptation comprises two steps: use time-aligned measurements of the input envelope and gain to form the AM—AM and AM-PM curves of the system, and the estimate of the coefficient adjustments that flatten these two curves.

The system gain is measured using a commercially available gain detector (see FIG. 8) whose differential log-magnitude (DLM) and phase detectors compare RF signals coupled from the input and output of the system. The input envelope, DLM, and phase measurements are time-aligned and digitized forming a sampled triple ($|x|$, $\log\{|G_{sys}|\}$, $\arg\{G_{sys}\}$). To reduce the cost of the analog-to-digital conversion, an asynchronous, sub-Nyquist sampling process is used, which is acceptable for memoryless nonlinearities. The sampled triples are accumulated over time to form AM—AM and AM-PM curves. The preferred storage structure for the curves are suitable indexed storage locations (or bins) implemented in a manner well known to those skilled in the art, indexed using quantized values of $|x|$ (the bin index is denoted by b). Within each bin, the number of samples N(b), the mean and variance of $\log\{|G_{sys}|\}$ (denoted by $m_{AM}(b)$ and $\sigma_{AM}^2(b)$, respectively), and the mean and variance of $\arg\{G_{sys}\}$ (denoted by $m_{PM}(b)$ and $\sigma_{PM}^2(b)$, respectively) are maintained. The number of samples per bin provides an estimate of the statistical properties of the input envelope. Sampled triples are accumulated until the distribution is valid before the estimator is called.

The AM—AM and AM-PM bin locations, denoted by LAM and LPM, respectively, are $$L_{AM}(b) = m_{AM}(b) - \log\{|G_o|\} \tag{6}$$

$$L_{PM}(b) = m_{PM}(b) - \arg\{G_o\} \tag{7}$$

where $\log\{|G_o|\}$ and $\arg\{G_o\}$ are DC levels. The weight for each bin, used later as part of a weighted estimation, is $$w_{AM}(b) = N(b) \cdot \sigma_{AM}^{-2}(b) \tag{8}$$

$$w_{PM}(b) = N(b) \cdot \sigma_{PM}^{-b}(b) \tag{9}$$

The weights reduce the influence of questionable measurements within the estimation.

The estimator 632, implemented using a DSP as discussed above, converts $L_{AM}$ and $L_{PM}$ into coefficient adjustments that, on average, improve the performance. Assume that the predistortion coefficients are offset slightly from the optimal values and that the offsets are denoted by $\Delta\lambda_m$, $\Delta z_{m1}$, $\Delta z_{m2}$, $\Delta z_{m3}$, $\alpha\lambda z_o$, $\Delta z_{p1}$, and $\Delta z_{p2}$. The relationship between the bin values and the coefficient offsets is $$L_{AM}(b) \approx -\Delta\lambda_m H_{m,0}(b) + \sum_n \Delta z_{m(n)} H_{m,n}(b) \tag{10}$$

$$L_{PM}(b) \approx -\Delta\lambda_p H_{p,0}(b) + \sum_n \Delta z_{p(n)} H_{p,n}(b) \tag{11}$$

$$H_{m,0}(b) = \prod_k (|x|_b - z_{m(k)}) \tag{12}$$

$$H_{m,n}(b) = \lambda_m \cdot \prod_{k \neq n} (|x|_b - z_{m(k)}). \tag{13}$$

where $|x|_b$ is the input envelope associated with bin b.

The magnitude and phase coefficient offsets are estimated separately using similar weighted least square approaches. For convenience, only the phase estimation is shown below. The phase cost function to be minimized is $$J_p = \sum_b w_{PM}(b) \cdot [\varepsilon_{PM}(b)]^2 \tag{14}$$

where $$\varepsilon_{PM} = L_{PM} + \Delta\lambda_p H_{p,0} - \sum_n \Delta z_{p(n)} H_{p,n}. \tag{15}$$

The estimate of the phase coefficient offsets is $$[\alpha\lambda_p \Delta z_{p1} \Delta z_{p2}]^T = M^{-1} \sim V \tag{16}$$

where (subscripts PM and p have been omitted below)

$$M = \begin{bmatrix} \sum_b wH_0^2 & \sum_b wH_0H_1 & \sum_b wH_0H_2 \\ \sum_b wH_0H_1 & \sum_b wH_1^2 & \sum_b wH_1H_2 \\ \sum_b wH_0H_2 & \sum_b wH_1H_2 & \sum_b wH_2^2 \end{bmatrix} \tag{17}$$

$$V = \begin{bmatrix} \sum_b wL \cdot H_0 & \sum_b wL \cdot H_1 & \sum_b wL \cdot H_2 \end{bmatrix}^T \tag{18}$$

Once the coefficient offsets are estimated, the absolute coefficients are adjusted:

$$\lambda_p(t_{k+1}) = \lambda_p(t_k) - \gamma \cdot \Delta\lambda_p \tag{19}$$

$$z_{p(n)}(t_{k+1}) = z_{p(n)}(t_k) - \gamma \cdot \Delta z_{p(n)} \tag{20}$$

where $0 < \gamma < 1$ is a convergence constant. The estimation of the magnitude offsets and the subsequent update of the magnitude coefficients are similar to the phase case mentioned above. After the coefficients have been adjusted, the measurements within $L_{AM}$ and $L_{PM}$ are purged and new measurements are accumulated.

The initial values of the zero crossings, $z_k$, are required to use the algorithm. They can be estimated from the AM—AM and AM-PM curves of the uncorrected PA or from default values obtained through routine testing.

As one specific example of the present invention, tested in a computer simulation, the analog baseband predistortion module 112 may comprise three magnitude zeros and two phase zeros as shown in FIGS. 3 and 4. The zeros of the magnitude and phase compensation are obtained from the forward gain error curves (AM—AM and AM-PM curves with the DC component removed) of the power amplifier. Each component of the gain error is fit to a polynomial function of the input magnitude (see equation (3)). The zeros are the roots of the polynomial function. The three zeros for the magnitude are [0.607 1.3244 2.0851]; the two zeros for the phase are [0.3162 1.5043]. The input signal is normalized so that the average power is unity. Since the input signal is normalized to unity, the offset term for the magnitude component is set to unity. The offset term for the phase component is set to zero. The scale terms for the magnitude and phase are computed using LMS estimation as described above.

As another specific example of the present invention, implemented and tested in hardware, the baseband predistortion module 112, shown in FIG. 4 was implemented using five analog multipliers as shown, each of which provides a W=(x2-x1)*(y2-y1)+z function (packaged in an 8-lead SOIC). The input signals used for testing were one- and two-carrier W-CDMA signals. The output power and center frequency were 45 dBm and 2140 MHz, respectively, in each case. The predistortion coefficients for the two examples were as follows: for one-carrier $(\lambda_m, z_{m1}, z_{m2}, z_{m3}; \lambda_p, z_{p1}, z_{p2})$=(0.551, 0.000, 0.346, 1.059; 0.281, 0.200, 0.600); for two-carriers (0.498, 0.000, 0.286, 1.110; 0.227, 0.197 0.590). Note that there are slight differences between the one- and two-carrier coefficients, which are due to bandwidth limitations within the gain detector affecting the estimation. It was noted during testing that the two-carrier performance was better using the coefficients estimated from the one-carrier waveform.

Further features and advantages of the invention will be appreciated by those skilled in the art. Also, the above described embodiments are purely illustrated and are not meant to be limiting in nature as a variety of modifications are possible.

What is claimed is:

1. A linearized power amplifier system, comprising:
    an input receiving an analog communication signal;
    a main signal path comprising a power amplifier, and a delay circuit and a vector modulator coupled between the input and the power amplifier;
    an output coupled to the output of the power amplifier;
    a signal splitter coupled to the input and providing a sampled input signal on a parallel signal path to the main signal path; and
    an analog baseband predistortion module configured in the parallel signal path and receiving the sampled input signal, the analog baseband predistortion module performing an analog predistortion operation employing the sampled input signal and zero crossing coefficients characterizing nonlinearity in the amplifier gain response and providing in phase and quadrature predistortion control signals to the vector modulator in said main signal path to predistort the input signal to correct for amplifier nonlinearity.

2. A linearized power amplifier system as set out in claim 1, wherein said analog baseband predistortion module comprises an envelope detector providing an analog envelope signal corresponding to the input signal envelope and a zero crossing specification circuit performing said predistortion operation on the analog envelope signal using said zero crossing coefficients.

3. A linearized power amplifier system as set out in claim 2, wherein said zero crossing specification circuit comprises a first plurality of addition circuits receiving zero crossing coefficients corresponding to the amplitude response of the amplifier and a second plurality of addition circuits receiving zero crossing coefficients corresponding to the phase response of the amplifier.

4. A linearized power amplifier system as set out in claim 3, wherein said zero crossing specification circuit further comprises a plurality of multiplier circuits coupled to said first plurality of addition circuits and one or more multiplier circuits coupled to said second plurality of addition circuits.

5. A linearized power amplifier system as set out in claim 4, wherein said first plurality of addition circuits comprises three addition circuits coupled in parallel to the envelope detector, each receiving a zero crossing coefficient, and wherein two multiplier circuits are coupled to said first plurality of addition circuits.

6. A linearized power amplifier system as set out in claim 4, wherein said second plurality of addition circuits comprises two addition circuits coupled in parallel to the envelope detector, each receiving a zero crossing coefficient, and wherein and one multiplier circuit is coupled to said second plurality of addition circuits.

7. A linearized power amplifier system as set out in claim 2, wherein said analog baseband predistortion module further comprises a scale and offset circuit for adjusting magnitude and phase scale and offset.

8. A linearized power amplifier system as set out in claim 7, wherein said scale and offset circuit comprises a multiplier receiving a magnitude scaling factor, a multiplier receiving a phase scaling factor, an addition circuit receiving a magnitude offset factor, and an addition circuit receiving a phase offset factor.

9. A linearized power amplifier system as set out in claim 1, further comprising a second signal splitter, coupled to the output and providing a sampled output signal, and an estimator, coupled to receive the sampled input signal and sampled output signal and providing said zero crossing coefficients to said analog baseband predistortion module on an adaptive basis.

10. A linearized power amplifier system as set out in claim 1, wherein said input signal is a wide bandwidth modulated communication signal selected from the group consisting of CDMA, WCDMA and UMTS modulated RF communication signals.

11. A linearized power amplifier system, comprising:
    an input receiving an analog communication signal;
    a main signal path comprising a power amplifier, and a delay circuit, a magnitude adjuster and a phase adjuster coupled between the input and the power amplifier;
    an output coupled to the output of the power amplifier;
    a signal splitter coupled to the input and providing a sampled input signal on a parallel signal path to the main signal path; and
    an analog baseband predistortion module configured in the parallel signal path and receiving the sampled input signal, the analog baseband predistortion module performing an analog predistortion operation employing the sampled input signal and zero crossing coefficients characterizing nonlinearity in the amplifier gain response and providing a magnitude adjuster control signal to the magnitude adjuster in said main signal path and a phase adjuster control signal to the phase adjuster in said main signal path to predistort the input signal to correct for amplifier nonlinearity.

12. A method for predistortion linearization of a power amplifier system comprising:
    receiving an input communication signal;
    splitting the input communication signal into a main input signal and a sampled input signal;
    providing the main input signal to a power amplifier;
    detecting the sampled input signal envelope;
    generating predistortion control signals using the product of first-order functions of the sampled input signal envelope offset by zero crossing coefficients; and
    applying the predistortion control signals to the main input signal prior to said amplifier to predistort the main input signal to compensate for nonlinearities in the power amplifier gain response.

13. A method for predistortion linearization of a power amplifier system as set out in claim 12, wherein said predistortion control signals correspond to the inverse complex gain of the power amplifier.

14. A method for predistortion linearization of a power amplifier system as set out in claim 12, wherein said zero crossing coefficients correspond to DC offsets at the locations of the intersection of a fixed AM—AM response with the actual AM—AM response curve of the power amplifier.

15. A method for predistortion linearization of a power amplifier system as set out in claim 14, wherein said zero crossing coefficients further correspond to DC offsets at the locations of intersection of a fixed AM-PM response with the actual AM-PM response curve of the power amplifier.

16. A method for predistortion linearization of a power amplifier system as set out in claim 12, wherein said applying the predistortion control signals to the main input signal comprises modulating the main input signal employing a vector modulator controlled by the predistortion control signals.

17. A method for predistortion linearization of a power amplifier system as set out in claim 12, wherein said predistortion control signals comprise magnitude and phase control signals.

18. A method for predistortion linearization of a power amplifier system as set out in claim 12, further comprising sampling the output of the power amplifier and adaptively estimating the zero crossing coefficients using the sampled input and sampled output signals.

19. A method for predistortion linearization of a power amplifier system as set out in claim 12, further comprising delaying said main input signal prior to applying the predistortion control signals to the main input signal.

20. A method for predistortion linearization of a power amplifier system as set out in claim 12, wherein said input signal is a wide bandwidth modulated communication signal selected from the group consisting of CDMA, WCDMA and UMTS modulated RF communication signals.

* * * * *